(12) United States Patent
Suvorov et al.

(10) Patent No.: US 10,867,797 B2
(45) Date of Patent: Dec. 15, 2020

(54) METHODS AND APPARATUSES RELATED TO SHAPING WAFERS FABRICATED BY ION IMPLANTATION

(71) Applicant: Cree, Inc., Durham, NC (US)

(72) Inventors: Alexander Suvorov, Durham, NC (US); Robert Leonard, Raleigh, NC (US); Edward Robert Van Brunt, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/269,837

(22) Filed: Feb. 7, 2019

(65) Prior Publication Data

US 2020/0258742 A1    Aug. 13, 2020

(51) Int. Cl.
| | |
|---|---|
| *H01L 21/336* | (2006.01) |
| *H01L 21/04* | (2006.01) |
| *H01L 29/06* | (2006.01) |
| *H01L 21/265* | (2006.01) |

(52) U.S. Cl.
CPC ........ *H01L 21/0415* (2013.01); *H01L 21/046* (2013.01); *H01L 21/26506* (2013.01); *H01L 29/0657* (2013.01)

(58) Field of Classification Search
None
See application file for complete search history.

(56) References Cited

U.S. PATENT DOCUMENTS

| | | | |
|---|---|---|---|
| 7,547,897 | B2 | 6/2009 | Suvorov |
| 8,288,220 | B2 | 10/2012 | Hull et al. |
| 9,768,259 | B2 | 9/2017 | Suvorov et al. |
| 2002/0104478 | A1 | 8/2002 | Oguri et al. |

FOREIGN PATENT DOCUMENTS

JP    59152581    *    8/1984

OTHER PUBLICATIONS

Pending U.S. Appl. No. 15/398,185, filed Jan. 4, 2017, entitled "Stabilized, High-Doped Silicon Carbide".

* cited by examiner

*Primary Examiner* — Jack S Chen
(74) *Attorney, Agent, or Firm* — Myers Bigel, P.A.

(57) ABSTRACT

The wafer fabrication technique uses an ion implantation process on the back side of the wafer to control the shape of the wafer. At least one first dopant is implanted into a front side of a wafer to dope the wafer. At least one second dopant is implanted into a back side of the wafer in a dopant profile to create a back side structure, where the back side structure controls a shape of the wafer. A blank wafer is provided that has an undoped front side and a form shaping back side structure on the back side. A doped wafer is provided that has a dopant implanted on the front side and a form shaping back side structure on the back side that least partially offsets the strain in the wafer induced by the front side dopant.

16 Claims, 11 Drawing Sheets

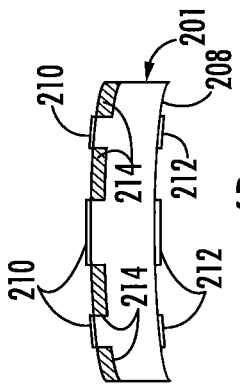
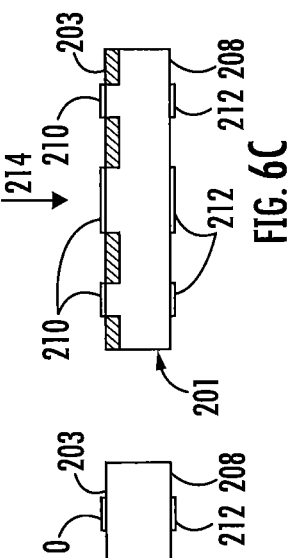
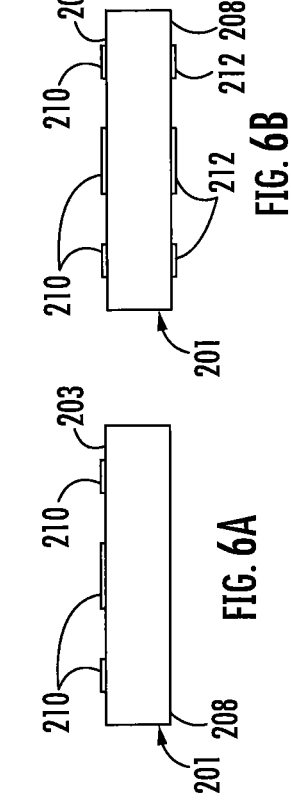
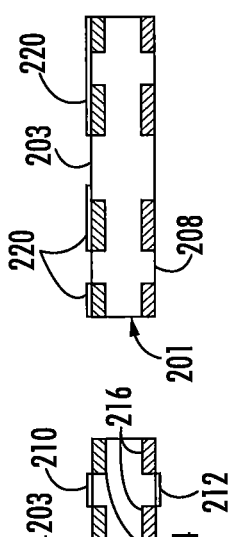
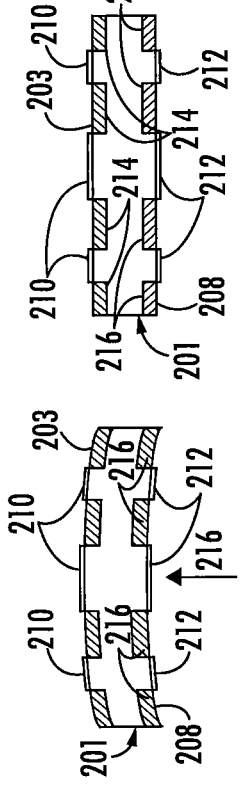
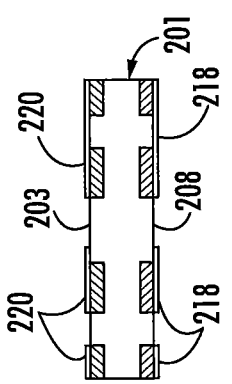

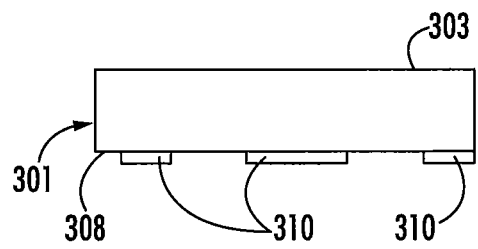
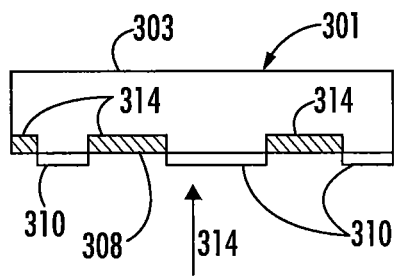
FIG. 26A          FIG. 26B
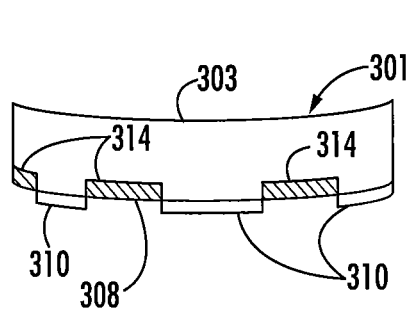
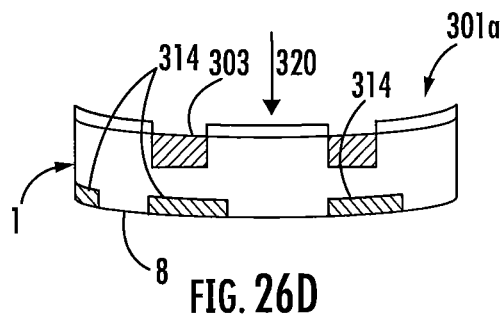
FIG. 26C          FIG. 26D
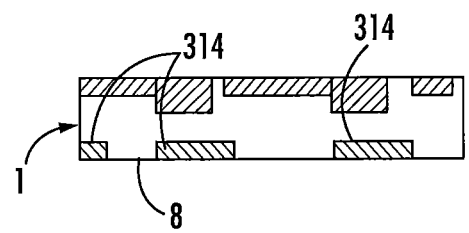
FIG. 26E

METHODS AND APPARATUSES RELATED TO SHAPING WAFERS FABRICATED BY ION IMPLANTATION

BACKGROUND

Ion implantation is a semiconductor device fabrication technique that may be used to change the electronic properties of a semiconductor wafer by adding specific dopants to the wafer. More particularly, in conventional ion implantation, a desired ion species to be implanted into the wafer may be ionized, accelerated to a predetermined kinetic energy, and directed as an ion beam towards the surface of a semiconductor wafer loaded in an ion implantation target chamber. Based on the predetermined kinetic energy, the desired ion species may penetrate into the semiconductor wafer to a certain depth. As such, ions may be embedded (i.e., implanted) into the semiconductor wafer, which may thereby alter the electrical properties of the semiconductor wafer.

SUMMARY

In some embodiments, a method of fabricating a wafer comprises implanting a first dopant into a front side of the wafer in a first ion implantation process. A second dopant is implanted into a back side of the wafer in a second ion implantation process. A dopant profile of the second dopant is selected to create a back side structure that controls a shape of the wafer.

The first ion implantation process may occur before the second ion implantation process or the second ion implantation process may occur before the first ion implantation process. The dopant profile of the structure may be the same as a dopant profile of the first dopant. The first ion implantation process may be performed under substantially the same conditions as the second ion implantation process. The first dopant may be implanted in a first pattern on the front side and the second dopant may be implanted in a second pattern on the back side where the first pattern and the second pattern may be the same or different. The first ion implantation process may be performed under different conditions than the second ion implantation process. The back side structure may comprise at least one of a ring pattern, a ribbed pattern, and a ring and ribbed pattern. The first ion implantation process may comprise implanting a first structure comprising at least two first dopants and the second ion implantation process may comprise implanting a second structure comprising at least two second dopants. The at least two first dopants may be implanted in an alternating manner with the at least two second dopants. The first dopant and the second dopant may be the same or different.

In some embodiments, a method of fabricating a wafer comprises implanting a first dopant into a front side of the wafer that induces a strain in the wafer. A second dopant is implanted into a back side of the wafer to create a doped structure in the back side of the wafer such that the doped structure at least partially offsets the strain in the wafer induced by the first dopant and deformation of the wafer is controlled.

The first dopant may be implanted under a first set of conditions and the second dopant may be implanted under a second set of conditions. The first dopant may be implanted in a first pattern on the front side of the wafer and the second dopant may be implanted in a second pattern on the back side of the wafer. The first pattern and the second pattern may be the same or different. The first set of conditions and the second set of conditions may be the same or different.

In some embodiments, a blank wafer comprises a front side and a back side and a dopant profile implanted into the back side for controlling the shape of the wafer. The dopant profile may comprise at least one of a ring pattern, a ribbed pattern, and a ring and ribbed pattern. The dopant profile may comprise at least two dopants. The dopant profile creates a back side structure. The back side structure may extend over less than the entire back side. The back side structure may be in a masked pattern. The front side may comprise an epitaxial layer.

In some embodiments, a wafer comprises a front side and a back side. A first dopant is implanted on the front side. A form shaping structure comprising a second dopant having a dopant profile is implanted on the back side. The first dopant may be implanted in a first pattern on the front side of the wafer and the second dopant may be implanted in a second pattern on the back side of the wafer. The first pattern and the second pattern may be the same or different. The first dopant and the second dopant may be the same or different.

In some embodiments, a method of making a blank wafer having a front side and a back side comprises determining a back side structure to at least partially offset a strain in the wafer induced by a second dopant applied to the front side. Implanting at least one first dopant profile into the back side of the wafer in an ion implantation process to create the back side structure.

A semiconductor device comprises a semiconductor layer having a front side and a back side. A first dopant is implanted into the front side. An epitaxial layer and a metalized layer are on the front side. A form shaping structure comprising a dopant profile implanted into the back side.

BRIEF DESCRIPTION OF THE DRAWINGS

FIGS. 6A through 6L illustrate an embodiment of a wafer fabrication process.

FIGS. 26A through 26E illustrate an embodiment of a wafer fabrication process.

DETAILED DESCRIPTION

Figure 1:
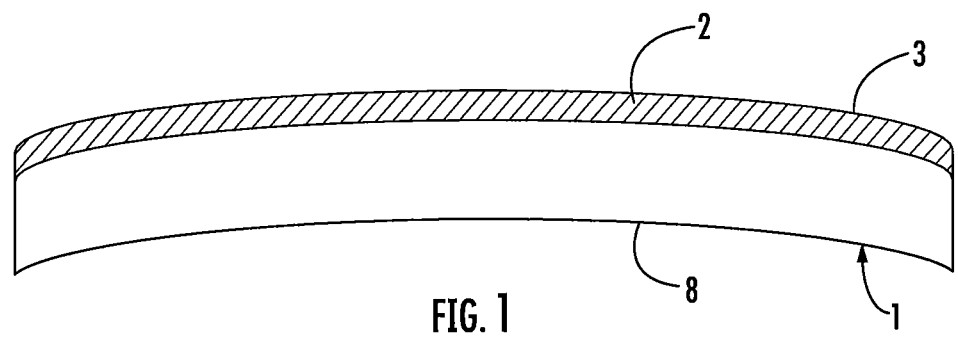
FIG. 1 is a section view of an embodiment of a doped wafer.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" or 'horizontal" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to illustrations that are schematic illustrations of idealized embodiments (and intermediate structures) of the invention. The relative dimensions, thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes and sizes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

Ion implantation is a flexible and convenient method for selectively doping portions of a crystal lattice layer as part of the fabrication process for semiconductor devices. Semiconductor devices are generally fabricated from monocrystalline silicon semiconductor material. The lattice is doped to control its electrical, optical and structural properties. In some embodiments, the semiconductor material comprises silicon carbide (SiC), although the semiconductor material may comprise any suitable semiconductor material. The methods and apparatuses disclosed herein may be used with any polytype of SiC including, but not limited to, 4H, 6H, 3C and 15R. In an ion implantation process, dopant ions are accelerated to a high energy, usually expressed in keV or MeV, and directed towards a front side of a semiconductor crystal lattice. The semiconductor lattice is sometimes referred to as a substrate, layer or wafer. The implants penetrate the semiconductor lattice and come to rest somewhere within the lattice. The number of ions implanted into a semiconductor lattice, referred to as the dose, is usually expressed in terms of ions per square centimeter. Selective implantation is performed by masking portions of the semiconductor material to prevent ions from penetrating the masked portions of the semiconductor material. Multiple doping processes may be performed to create a semiconductor lattice with doped layers, also sometimes referred to as stacking. The doped structure may then be further processed to create semiconductor devices. The term "wafer" is used herein to mean a substrate having an epitaxial growth layer thereon. The invention may be used with any type of substrate having any type of epitaxial layer grown thereon. One example is a wafer comprising a SiC substrate with a SiC epitaxial layer grown on the SiC substrate.

It is desirable to increase the size of the semiconductor wafer to economically increase semiconductor device production capacity and thereby reduce the cost of the semiconductor devices. However, semiconductor wafers are subject to internal stresses that are proportional to the radius of the wafer squared. As a result, it is difficult to economically fabricate larger diameter semiconductor wafers of high quality. Processes used in wafer production can modify the wafer's internal strains and stresses and cause warping or deformation of the wafer. If the deformation of the wafer is too great, the wafer may not be suitable for device fabrication. It has been observed that warping of wafers exceeding tolerance limits for device fabrication may occur when known ion implantation techniques are used. While the techniques described herein have particular relevance to large diameter wafers, the techniques may be advantageously used with wafers of any size.

In ion implantation, dopant atoms including, but not limited to, nitrogen, phosphorus, aluminum and/or boron are introduced selectively into the semiconductor wafer to make the active device structures. Issues may arise as a result of the implantation of the dopant and the doping process. One issue is that the dopant atoms are typically physically smaller or larger than the atoms that they replace, for example, the silicon or carbon atoms in a SiC wafer. This causes an expansion and/or contraction of the crystal lattice, and introduces a strain field. Another issue is that during the doping process the act of introducing dopant atoms causes significant heating of the wafer, which can change the crystal structure and introduce strains. Additionally, the act of introducing the dopant atoms displaces atoms in the semiconductor crystal lattice, thereby creating vacancies, interstitials or complexes thereof. This effect may be referred to as implant damage, and may adversely affect the operation of the device if the extra or missing atoms introduce electronic states into the semiconductor band structure.

The wafer fabrication techniques described herein offset the deleterious effects caused by the ion implantation process on the front side of the wafer. The wafer fabrication techniques use an ion implantation process on the back side of the wafer to control the shape of the wafer. In one preferred embodiment, the shape of the wafer is controlled to create a flat, planar wafer. In one embodiment, the doping process that is performed on the front side of the wafer is repeated on the back side of the wafer. The implantation process performed on the back side of the wafer may be under the same conditions including dopant, dose, energy, dose rate, temperature, pressure and pattern as the doping process performed on the front side of the wafer. For example, to the extent the front side of the wafer is implanted in a masked pattern, the back side of the wafer may, in some embodiments, be implanted in the same masked pattern. Performing the same ion implantation process on the back side of the wafer as the front side of the wafer causes the stresses and strains that are induced on the front side of the wafer to be balanced by equal or similar stresses and strains induced on the back side of the wafer. Offsetting the stresses and strains that are induced on the front side of the wafer prevents or reduces warpage and/or deformation of the wafer such that the resulting wafer is substantially planar and is suitable for further processing.

In other embodiments, the implantation processes performed on the front side and the back side of the wafer, and the structures formed on the front side and back side, may not be identical, provided that the stresses and strains induced on the back side of the wafer sufficiently offset the stresses and strains induced on the front side of the wafer to prevent unacceptable warpage and/or deformation of the wafer. In such embodiments the ion implantation process performed on the back side of the wafer may be under different conditions, including dopant, dose, energy, dose rate and pattern, than the implantation process performed on the front side of the wafer.

In other embodiments, it may be desirable to create a wafer that is other than planar. The processes of the invention may be used to shape a wafer into a desired shape that, while not planar, has a desired curvature. In such an embodiment, the ion implantation process on the back side of the wafer may selectively offset some of the stresses and strains induced on the front side of the wafer while selectively complimenting other of the stresses and strains induced on the front side of the wafer to control the curvature of the wafer and create a desired wafer profile.

The back side implantation process as described herein implants a dopant profile into the wafer. The term "profile" or "dopant profile" as used herein means the physical description of the dopant in the wafer. The profile may include the dopant concentration or dose, the type of dopant, and the depth of the dopant in the lattice. While the dopant profile is related to the implantation process used to implant the dopant, the dopant profile refers to the physical arrangement of the dopant atoms as embedded in the wafer. The profile of the dopant atoms in conjunction with the structure of the wafer lattice creates a back side structure. The back side structure is the physical structure of the wafer after the dopant is implanted in the back side and is the structure created by the implanted dopant atoms and the crystal lattice. The dopant profile and the created back side structure refers to dopants implanted into the back side of the wafer and does include dopant atoms that may be present in the wafer as a result of the growth of the epitaxial layer. It is to be understood that when reference is made to the "same profile" being implanted into, or the "same structure" being created in, the front side and back side of the wafer, it is intended to mean that the same or similar processes under the same or similar conditions are used to implant the two dopant profiles; however, the actual physical structure of the lattice may be different on a microscopic level because of the inherent limitations of the ion implantation process. Moreover, the term "dopant" as used herein when referring to the implanted shape controlling material and the resulting shape controlling structure includes both electrically active materials and electrically inactive, or inert, materials such as one or more of the noble gases including helium, neon, argon, krypton, and/or radon. In one preferred embodiment, argon may be used as the back side dopant. Moreover, the resulting implanted shape controlling structure may be electrically inactive or electrically active regardless of the nature of the material implanted in the wafer. Because the shape controlling structure is used primarily to control the shape of the wafer and is not used to modify the electrical properties of the semiconductor material, both the implanted material and the resulting structure may be electrically non-conductive. The term "dopant' as used herein to describe the shape controlling material and the resulting structure is intended to encompass both types of materials and structures.

The beneficial effects of the process have been shown on a 150 mm (diameter) SiC wafer with aluminum implants. Referring to FIG. 1, a cross-section of a wafer 1 is shown that has been doped in area 2 only on the front side 3 of the wafer. In the drawings the unshaded areas represent areas where no dopant is implanted and the shaded areas represent areas where the dopant is implanted. As a result of the ion implantation process, the wafer is warped and tends to bow to form a shallow "cup" shaped wafer. The wafer 1, as shown in FIG. 1, is typical of a doped wafer fabricated using existing ion implantation techniques. It is to be understood that the terms "front side" and "back side" of the wafer are used to distinguish the two major sides of the wafer where the front side is the side of the wafer which includes the conventional doped electrically active layers, etching, metallization layers and the like and the back side is the side of the wafer which includes the shape forming structure as described herein.

Figure 2:
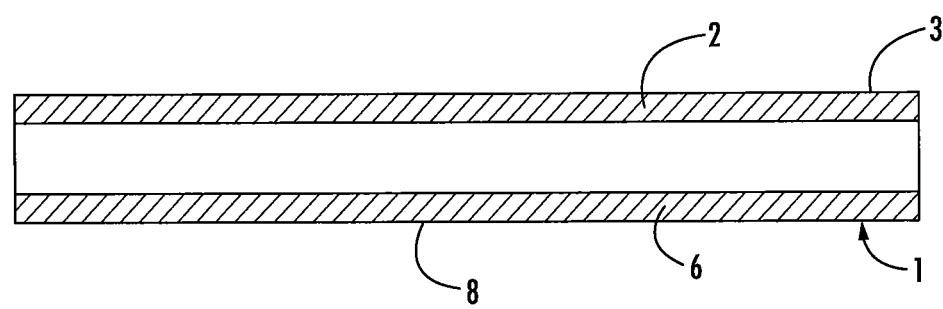
FIG. 2 is a section view of an embodiment of a doped wafer with a back side structure.

FIG. 2 is a cross-section of wafer 1 that comprises the implanted doped area 2 on the front side 3 of the wafer and has a shape forming structure 6 implanted on the back side 8 of the wafer. Because the stresses and strains induced on the back side 8 of the wafer offset the stresses and strains formed on the front side 3 of the wafer, the wafer 1 is formed into a planar shape and warping of the wafer is eliminated or substantially reduced. In the embodiment of FIGS. 1 and 2 both the front side 3 and the back side 8 of the wafer 1 are substantially completely doped under the same conditions using the same dopant to create the same dopant profiles on each side of the wafer. As a result the expansion of the lattice caused by the front side implant is offset by substantially equal expansion of the lattice caused by the back side implant.

Ion implantation may be performed in an apparatus as described, for example, in U.S. Pat. No. 7,547,897, issued to Suvorov on Jun. 16, 2009 and entitled "High-temperature ion implantation apparatus and methods of fabricating semiconductor devices using high-temperature ion implantation," assigned to the assignee of the present application, the disclosure of which is incorporated by reference herein in its entirety. While embodiments of suitable ion implantation apparatuses are shown and described, the processes of the invention may be performed in any suitable ion implantation apparatus.

Figure 3:
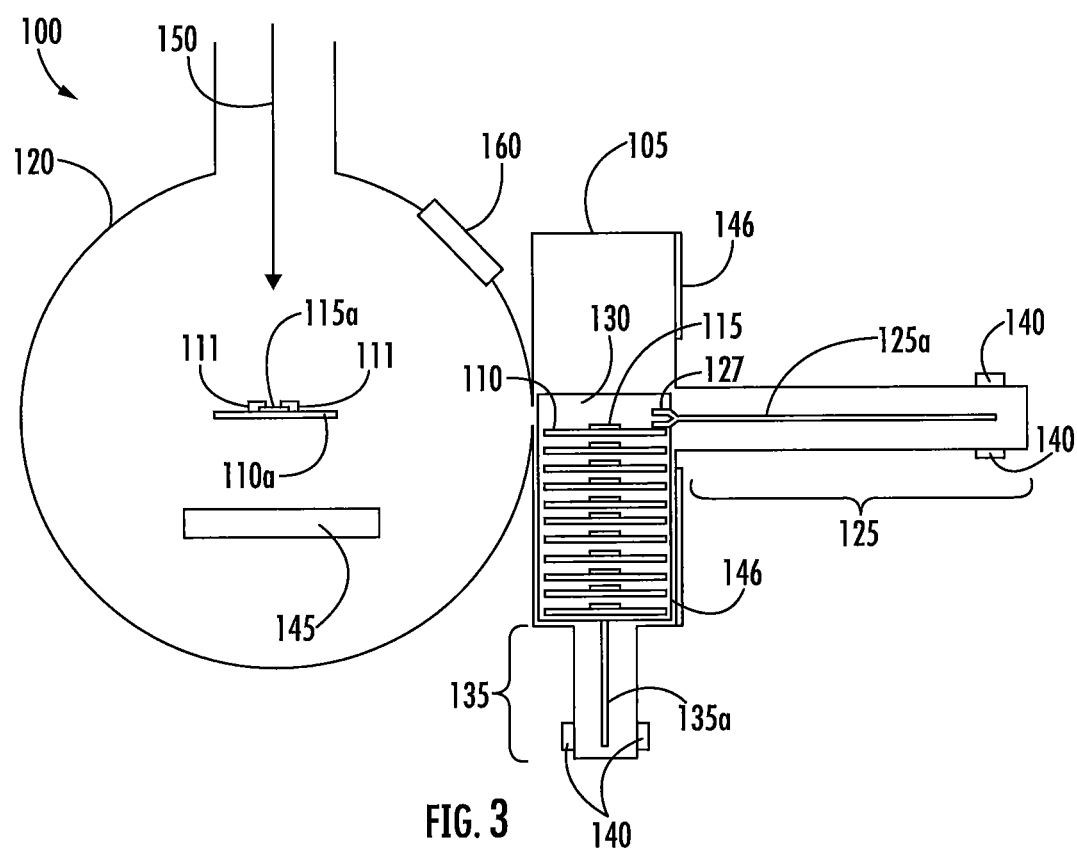
FIGS. 3 and 4 are schematic diagrams of an embodiment of ion implantation apparatus.
Figure 4:
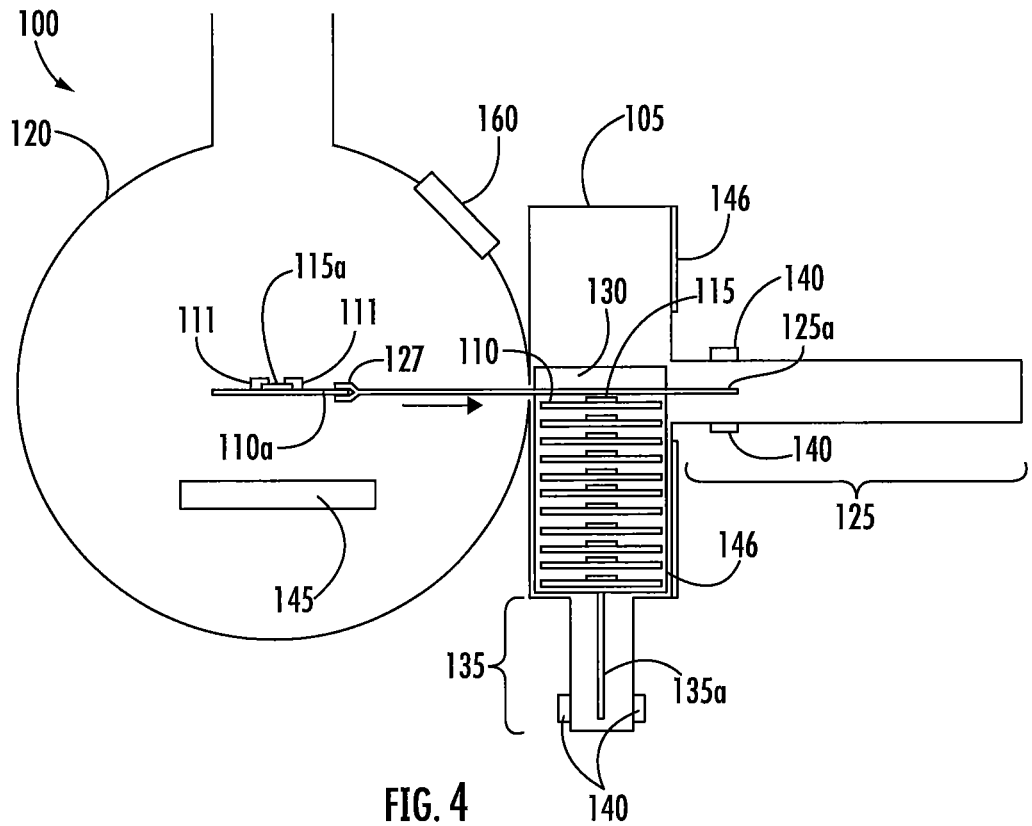

Referring to FIGS. 3 and 4, an embodiment of an ion implantation apparatus 100 is shown. The ion implantation apparatus may include a load lock chamber 105, an ion implantation target chamber 120 that is hermetically connected to the load lock chamber 105, and a loading assembly 125. The load lock chamber 105 is configured to store a plurality of wafer plates 110 therein. Each of the wafer plates 110 holds at least one semiconductor wafer 115 thereon. The wafer plates 110 may comprise a flat plate having a shallow depression or counterbored aperture for receiving a wafer 115 and may include a plurality of resilient clips or other holding devices 111 that are configured to removably but securely attach the semiconductor wafer 115 to the wafer plate 110.

The ion implantation target chamber 120 is configured to implant a desired ion species or dopant 150 into a semiconductor wafer 115a on a currently loaded wafer plate 110a at desired conditions. The ion implantation target chamber 120 may include a heating element 145 that is configured to provide a desired temperature based on the composition of the currently loaded semiconductor wafer 115a and/or the particular ion species to be implanted. For example, the heating element 145 may be an infrared or quartz lamp that is configured to heat wafers inside the ion implantation target chamber 120.

The loading assembly 125 is configured to load a next one of the wafer plates 110 from the load lock chamber 105 into the ion implantation target chamber 120 and to unload the currently loaded wafer plate 110a from the ion implantation target chamber 120 after implantation of the ion species 150. More specifically, the loading assembly 125 may include a loading arm or other robotic device 125a that is configured to unload the currently loaded wafer plate 110a from the ion implantation target chamber 120 into the load lock chamber 105. The loading arm 125a is also configured to load a next one of the loaded wafer plates 110 from the load lock chamber 105 into the ion implantation target chamber 120.

The load lock chamber 105 may include a cassette 130 that holds a plurality of wafer plates 110. A cassette advancing assembly 135 including a drive system 135a may be configured to consecutively present the wafer plates 110 in the cassette 130 to the loading assembly 125. In place of the cassette 130, the plurality of wafer plates could be stored on a rotating wheel or other device that is configured to load the plurality of wafer plates into the ion implantation target chamber 120. Accordingly, the wafer plates 110 including the semiconductor wafers 115 thereon may be loaded sequentially (or in any specified order) from the load lock chamber 105 into the ion implantation target chamber 120. In some instances, a pre-heated wafer plate may be loaded into the ion implantation target chamber 120 using heaters 146. The ion implantation target chamber 120 may include a window 160 to allow measurement of a thermal emissivity of a semiconductor wafer on a wafer plate in the ion implantation target chamber 120.

The ion implantation target chamber 120 may be configured to implant a desired ion species 150 into the semiconductor wafer 115a on the currently loaded wafer plate 110a. One or more different species may be implanted into each semiconductor wafer and different semiconductor wafers may be loaded with different species. The implantation processes may be performed under different conditions, including dopant, dose, energy, dose rate, temperature, pressure and mask pattern. The implant conditions in the ion implantation target chamber 120 may be adjusted based on the composition of the currently loaded wafer, the desired ion species to be implanted, the dose, etc.

The wafer plates 110 may be releasably secured to the loading arm 125a to facilitate loading and unloading of the wafer plates into and out of the ion implantation target chamber 120. The loading arm 125 may include a gripper, jaws, key and lock, or other mechanism to releasably secure the loading arm 125a to a wafer plate. After loading the wafer plate 110a with the wafer 115a into the ion implantation target chamber 120, the arm 125a may release the wafer plate and be retracted out of the ion implantation target chamber so that ion implantation may be performed on the semiconductor wafer 115a. After ion implantation, the loading arm 125a may be extended back into the ion implantation target chamber 120 to engage the wafer plate 110a and unload the wafer plate 110a from the ion implantation target chamber. Suitable drive and control systems 140 may be provided to actuate the loading assembly 125 and/or the cassette advancing assembly 135. While one embodiment of an ion implantation apparatus is described any suitable apparatus may be used. Any of the processes described herein may be automated.

Figure 5:
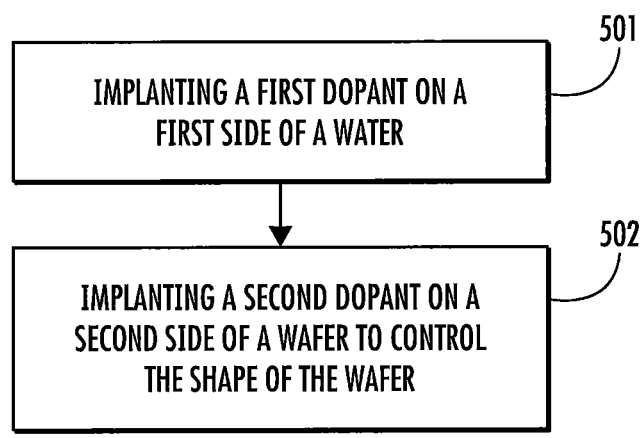
FIG. 5 is a block diagram of an embodiment of a method of fabricating a wafer.

One embodiment of a method of fabricating a wafer will be described with respect to FIG. 5. At least one first dopant is implanted into the front side of the wafer in a first ion implantation process (Block 501). The dopant may be applied using any suitable ion implantation apparatus and process to create the electrically active areas of the wafer. At least one second dopant is implanted into the back side of the wafer in a second ion implantation process to implant the dopant profile and to create the back side structure having a dopant profile (Block 502). The dopant may be applied using any suitable ion implantation apparatus and process. The back side dopant profile and structure is used to control and form a desired shape of the wafer by controlling the induced stresses and strains induced in the back side of the wafer and to thereby control the expansion and contraction of the wafer. In one preferred embodiment, the implantation of the back side shape forming dopant profile into the second side of the wafer is controlled to substantially offset the stresses and strains induced by the doping of the front side to create a substantially flat wafer. To create a flat wafer, the implantation process on the second side of the wafer may be the same as the implantation process on the first side. To create a flat wafer, the implantation process on the second side may be different than the implantation process on the first side provided that the implanted back side structure substantially offsets stresses/strains and expansion/contraction in the wafer induced by the doping of the front side. While in a preferred embodiment the implanting of the second side of the wafer is selected to provide a substantially flat wafer, the implantation of the second side of the wafer may be performed to provide a wafer having a shape other than flat. For example, in some embodiments it may be desirable to provide a wafer that has a predetermined curvature. The techniques described herein may be used to control the shape of the wafer to be flat or to have another shape.

In the method described above, the first ion implantation process may occur before the second ion implantation process, the second ion implantation process may occur before the first ion implantation process, or the first ion implantation process and the second ion implantation process may occur substantially simultaneously. In the method described above, the second ion implantation process may be the same as the first ion implantation process where, for example, the second ion implantation process is performed under the same conditions, including, for example, the same dopant, dose, energy, pattern, temperature, pressure and dose rate as the first ion implantation process to create the same dopant profiles on both sides of the wafer. The second ion implantation process may be similar to the first ion implantation process where, for example, the second ion implantation process is performed under similar conditions as the first ion implantation process but where one or more of the conditions are different than in the first ion implantation process to create similar dopant profiles on both sides of the wafer. The second ion implantation process may be different than the first ion implantation process where, for example, the second ion implantation process is performed under different conditions than the first ion implantation process to create the different dopant profiles on each side of the wafer.

Another embodiment of a method of fabricating a semiconductor device will be described with respect to FIGS. 6 and 7. A first side 203 of the wafer 201 is masked in a first pattern using a mask 210 (FIG. 6A, Block 701). In one preferred embodiment, the first side 203 is the front side of the wafer. A second side 208 of the wafer 201 is masked in a second pattern using a mask 212 (FIG. 6B, Block 702). In one preferred embodiment, the second side 208 is the back side of the wafer. In one preferred embodiment, the first masked pattern on the on the first side 203 and the second masked pattern on second side 208 are substantially the same. A first dopant 214 is implanted into the front side 203 of the wafer 201 in the masked pattern in a first ion implantation process under a first set of conditions (FIG. 6C, Block 703). Any suitable dopant or combination of dopants 214 may be applied using any suitable ion implantation apparatus and process. The dopant may comprise, for example, nitrogen, phosphorus, aluminum and/or boron but any suitable dopant may be used. As a result of the ion implantation process, the wafer 201 may warp as shown in FIG. 6D due to the stresses/strains and expansion/contraction induced in the front side 203. A second dopant 216 is implanted on the back side 208 of the wafer 201 in a masked pattern in a second ion implantation process under the first set of conditions (FIG. 6E, Block 704). The profile of the dopant implanted on the back side is the same as the dopant profile of the dopant implanted on the front side such that the resulting back side structure substantially offsets the stresses/strains and expansion/contraction in the wafer induced by the first dopant 14. In such a process, the structure implanted on the back side of the wafer is the same as the doped structure implanted on the front side of the wafer. The wafer 201 is shaped into a substantially flat wafer as shown in FIG. 6F. If the doping process is complete, the masks 210, 212 may be removed and the wafer is prepared for further processing.

If additional dopant is to be applied to the front side, the process may be repeated (Block 705). The process may be repeated for each implantation process performed on the first side of the wafer such that for each implantation process on the first side, the same implantation process is repeated on the second side in an alternating manner. The first side 203 of the wafer 201 is masked in a third pattern using a mask 220 (FIG. 6G). The second side 208 of the wafer 201 is masked in a fourth pattern that may be the same as the third pattern using a mask 218 (FIG. 6H). A third dopant 222 is implanted on the front side 203 of the wafer 201 in the third pattern in a third ion implantation process under a third set of conditions (FIG. 6I). The dopant may be applied using any suitable ion implantation apparatus and process. The wafer may be warped due to the stresses/strains and expansion/contraction induced in the front side 203 by the third ion implantation process (FIG. 6J). A fourth dopant 224 is implanted on the back side 208 of the wafer 201 in a fourth ion implantation process under the third set of conditions.

The dopant profile of the dopant implanted on the back side is the same as the dopant profile of the dopant implanted on the front side such that the resulting back side structure substantially offsets the stresses/strains and expansion/contraction induced in the wafer by the third ion implantation process (FIG. 6K). In such a process, the structure resulting from the implantation on the back side of the wafer is the same as the doped structure implanted on the front side of the wafer. The wafer is shaped into a substantially flat wafer (FIG. 6L). In this manner, a flat wafer is provided for each successive implantation process. After the wafer is fully doped it is in a flat state for further processing.

Figure 7:
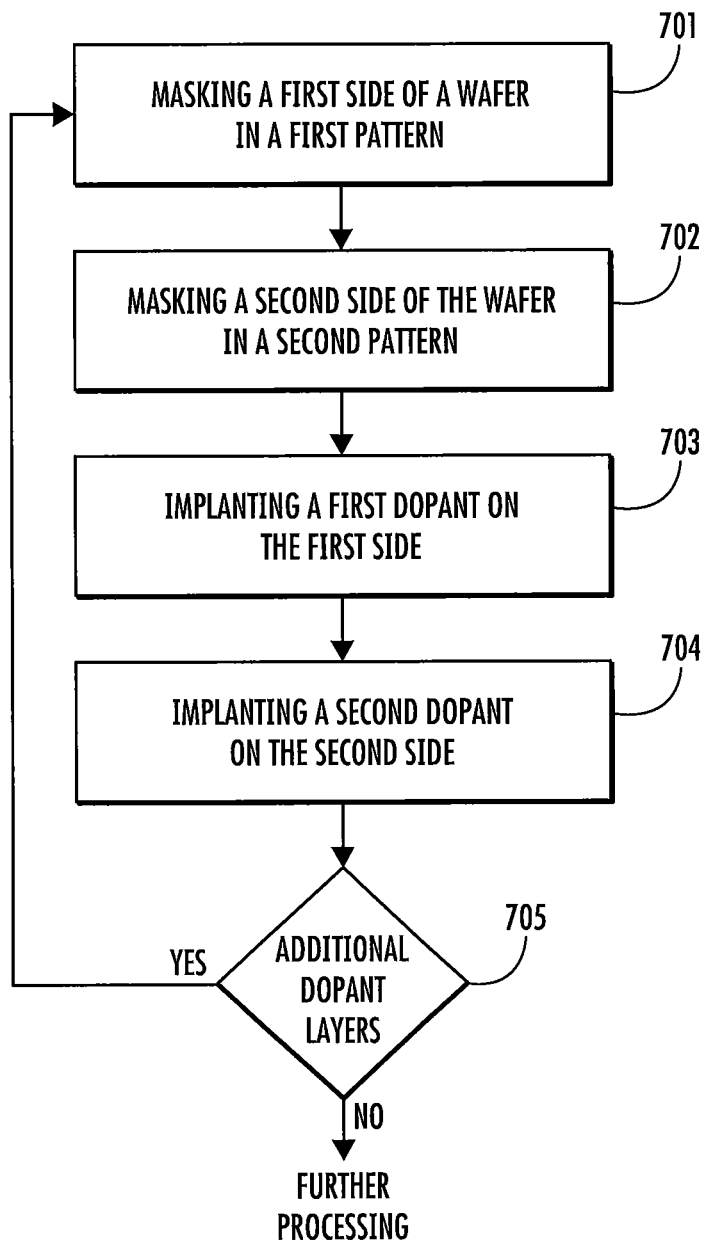
FIG. 7 is a block diagram of an embodiment of a method of fabricating a wafer.
Figure 8:
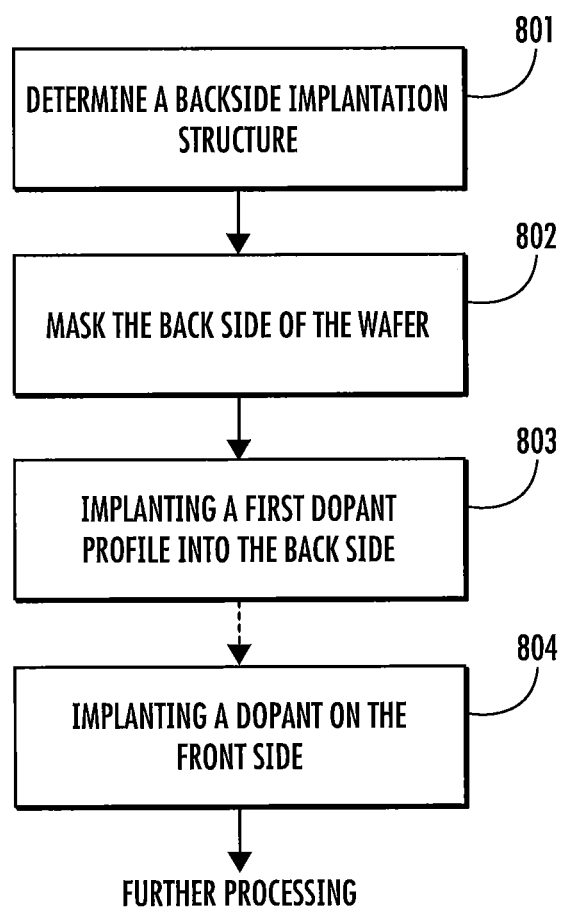
FIG. 8 is a block diagram of an embodiment of a method of fabricating a wafer.

In one preferred embodiment the implantation process on the back side is performed after the implantation process on the front side as described with respect to FIGS. 6 and 7. The masks used to create a patterned implantation are relatively soft. If the back side is implanted before the front side there is a risk that the mask on the front side will be damaged by the wafer holder. However, where damage to the front side is not a concern either the front side or the back side may be implanted first.

While the implantation process on the second side 208 may be performed after each implantation process on the first side 203, in some embodiments, the implantation process on the second side 208 may be performed only after selected ones of the implantation processes on the first side 203. It is known that different dopants have different molecular sizes. While deformation of the wafer may be affected by conditions such as temperature, dose or the like, generally, the deformation of the wafer is greater with large molecule dopants and is less with small molecule dopants. Therefore, depending on the dopant and other conditions, it may not be necessary to perform the implantation process on the second side of the wafer if the implantation process on the first side of the wafer does not significantly deform the wafer. Moreover, the implantation process on the second side of the wafer may be performed after plural implantation processes on the front side of the wafer. In this and in the other embodiments described herein, the implantation of the wafer may be done on both polished and unpolished front side and back side surfaces.

In the process described with respect to FIGS. 6 and 7, where the implantation of the back side structure is performed as part of the doping process of the front side of the wafer, the back side may be implanted with a dopant profile to create a back side structure that is different than the doped structure of the front side, provided that the desired finished shape of the wafer is achieved. The implantation of the back side dopant profile may be performed under different conditions than the doping of the front side, including the mask pattern, dopant etc. For example, the implantation of the back side dopant profile may use an electrically inactive material such as one of the noble gases including helium, neon, argon, krypton, xenon, and/or radon. In one preferred embodiment, argon may be used as the back side dopant. The resulting structure on the back side of the wafer may be different than the implanted area on the front side of the wafer provided that the implantation process on the back side offsets the deformation caused by the implantation processes on the front side of the wafer. Because the structure created on the back side of the wafer by the implanted doping profile may be used to counteract warping of the wafer, the implantation, pattern on the back side may be selected to offset the stresses/strains and expansion/contraction created on the front side of the wafer even where the implantation patterns and conditions on each side of the wafer are not identical. Embodiments of suitable back side structures are described below.

Figure 27A:
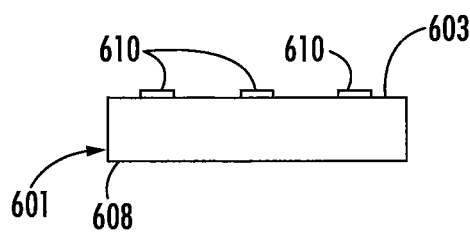
FIGS. 27A through 27F illustrate an embodiment of a wafer fabrication process.
Figure 27B:
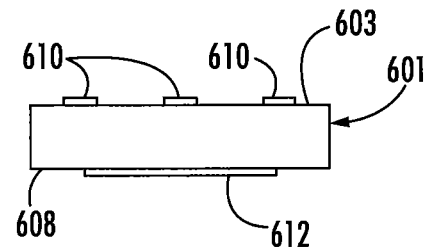
Figure 27C:
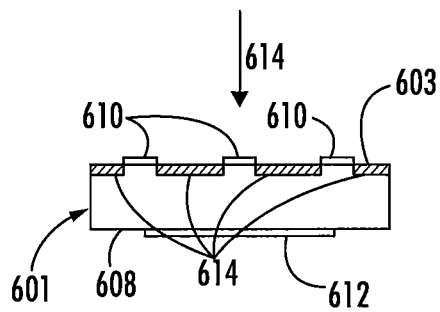
Figure 27D:
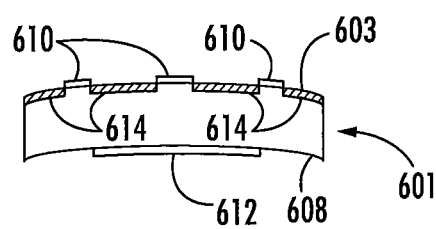
Figure 27E:
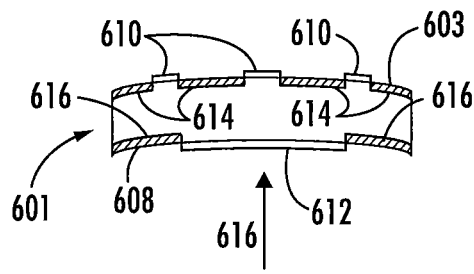
Figure 27F:
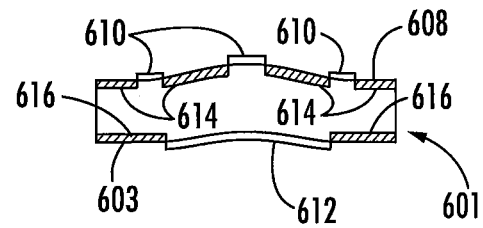

The techniques disclosed herein may also be used to shape the wafer into shapes other than flat. The strains induced on each side of the wafer may be selected to either offset or complement one another and the patterns and conditions of the implantation may be different on each side of the wafer. In the process described with respect to FIG. 6 the back side structure was selected to offset the strains and stresses induced on the front side to create a flat wafer. Referring to FIGS. 27A through 27F, an embodiment of a process in which the wafer shape is controlled to create a wafer having a shape other than flat is described. A first side 603 of the wafer 601 is masked in a first pattern using a mask 610 (FIG. 27A, Block 701). In one preferred embodiment, the first side 603 is the front side of the wafer. A second side 608 of the wafer 601 is masked in a second pattern using a mask 612 (FIG. 27B, Block 702). In one preferred embodiment, the second side 608 is the back side of the wafer. Unlike in the prior embodiment, the first masked pattern 610 on the on the first side 603 and the second masked pattern on second side 608 are different from one another. A first dopant 614 is implanted into the front side 603 of the wafer 601 in the first pattern in a first ion implantation process under a first set of conditions (FIG. 27C, Block 703). The dopant 614 may be applied using any suitable ion implantation apparatus and process. As a result of the ion implantation process, the wafer 601 may warp as shown in FIG. 27D due to the stresses and strains induced in the front side 603. One or more second dopants 616 are implanted on the back side 608 of the wafer 601 in a second ion implantation process that may partially offset and/or partially compliment the stresses/strains and expansion/contraction in the wafer induced by the first dopant 614 (FIG. 27E, Block 704). The doping profile and resulting back side structure is created in part by the doping pattern but also by the implant conditions including dopant species, dose, energy, temperature, pressure, and dose rate. For example, the size of the atoms implanted into the back side may be different than the size and dose of the atoms implanted into the front size such that the curvature of the wafer may be selectively reduced or increased in different areas of the wafer. These conditions may be controlled for the back side implantation process to control the shape of the wafer. The wafer 601 is formed into a shape that is other than flat as shown in FIG. 27F. The masking and shape shown in the figures is for explanatory purposes only and the wafer may be shaped in a manner other than as specifically shown herein. If the doping process is complete, the masks 610, 612 may be removed and the wafer is prepared for further processing. If additional dopant layers are to be applied, the process may be repeated (Block 705).

In addition to shaping the wafer, the techniques disclosed herein reinforce the wafer by creating the back side structure such that a more rigid wafer may be fabricated. Reinforcing the wafer to increase rigidity allows thinner wafers to be fabricated. In this and in other embodiments described herein the implanted shape controlling material and the resulting shape controlling structure may be implanted on the front side of the wafer. In such embodiments, the implanted material and the resulting structure are not used to modify the electrical properties of the semiconductor material. The wafer shape may be, in part, controlled by a shape controlling material implanted on the front side where the front side is also implanted with a dopant that is electrically active and that modifies the electrical properties of the semiconductor material. In such an embodiment, the implantation of the back side structure may also be performed as described herein to control the shape of the wafer based on the dopant implanted on the front side.

Other embodiments of methods and apparatuses of the invention will be described with respect to FIGS. 8 through 24. The process of creating the back side structure may be performed separate from the doping process of the front side of the wafer. In this embodiment, a blank wafer may be produced as opposed to the doped wafer of FIGS. 6 and 7. As used herein, a "blank" wafer is a wafer that includes the implanted doping profile and the resulting back side structure but that does not include a fully doped front side. The blank wafer is formed to have an intermediate shape. The front side of the blank wafer may be subsequently doped to create a doped wafer having a final desired shape. In this embodiment, an implanted back side doping profile and resulting back side structure is determined for a back side of the wafer (Block 801). The back side structure is selected to obtain a desired intermediate shape of the blank wafer such that when the blank wafer is fully doped, the wafer will have the desired final shape. The back side structure may be determined based on the shape of the wafer that would have been induced by the front side doping absent the back side structure. In other words, the back side structure is selected to offset or compliment the strains that will be induced in the wafer by the subsequent front side doping. In one preferred embodiment, the desired shape of the fully doped wafer is flat; however, the final shape may be other than flat. The back side dopant profile and resulting back side structure of the blank wafer depends on the doping process to be applied to the front side of the wafer including dopant, dose, energy, pattern, dose rate, temperature, pressure and/or other conditions. In some embodiments a "universal" back side structure may be used where the back side structure provides the desired final shape and rigidity of the fully doped wafer over a range of front side doping implants.

Once the back side doping structure is determined, the back side 308 of the wafer 301 is masked in the determined masked pattern using masks 310 (FIG. 26A, Block 802). It is noted that the back side 308 may also be doped uniformly across its entire surface such that no masking is required. Ion implantation is performed on the back side of the wafer in a first ion implantation process to implant the back side dopant profile with one or more dopants 314 (FIG. 26B, Block 803). The back side dopant profile may be implanted in a series of masking and implantation steps to create a layered structure. The dopant may be applied using any suitable ion implantation apparatus, process and conditions. The ion implantation process is performed using a selected dopant, dose, energy, pattern, temperature, pressure and/or dose rate to create the desired back side structure having desired induced strains/stresses and expansion/contraction. As previously explained, the dopant implanted in the back side of the wafer and the resulting structure may or may not be electrically active. A wafer implanted on the back side with the desired dopant profile to create the desired wafer shaping structure may be considered a blank wafer suitable for use in an ion implantation doping process. The blank wafer 301a, having the back side structure, has a desired shape and may experience warpage or deformation as represented in FIG. 26C. The back side structure, dopant profile and implantation conditions are selected for the blank wafer 301a such that the doped wafer assumes the desired final shape, e.g. flat, after front side doping.

The doping process on the front side 308 of the blank wafer 301a may be performed in a second ion implantation process with a dopant 320 (FIG. 26D, Block 804). The doping process on the front side 308 may comprise multiple doping implantations to create a layered or stacked structure. The doping process on the front side may be performed relatively immediately after the back side structure is implanted or the doping process on the front side may be removed in time and space from the implanting process on the back side of the wafer. In one embodiment, the implanted back side structure substantially offsets the stresses/strains and expansion/contraction in the wafer induced by the front side doping process to provide a flat wafer, as previously described with respect to FIG. 26E. In other embodiments the back side structure in combination with the front side doping process creates a wafer having a desired non-flat shape, as previously described. The fully doped wafer is in a condition for further processing.

Figure 9:
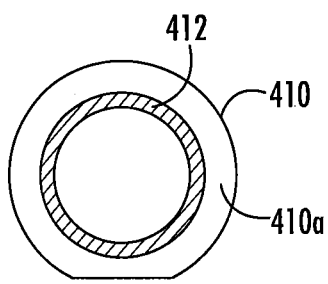
FIGS. 9 through 25 are views illustrating embodiments of wafers illustrating various back side structures.
Figure 10:
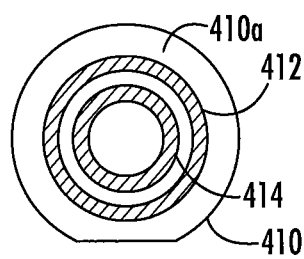
Figure 11:
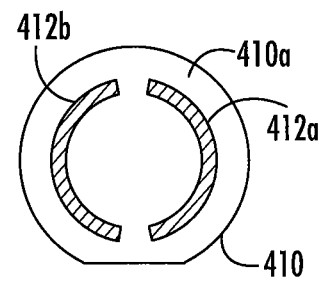
Figure 12:
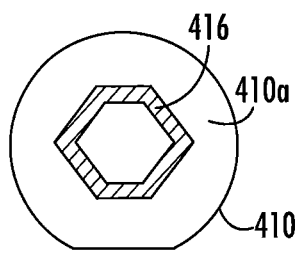
Figure 13:
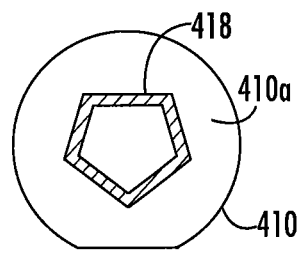
Figure 14:
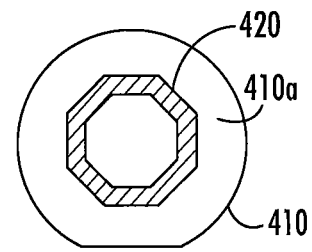
Figure 15:
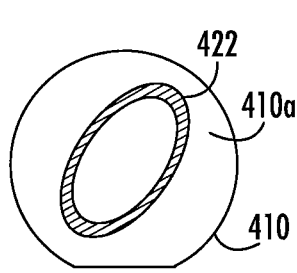
Figure 16:
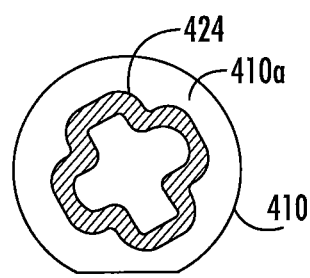

Referring to FIGS. 9 through 23, example mask patterns for the back side structures for a wafer are shown. In one embodiment, the back side 410a of a wafer 410 may be doped with a ring structure 412. The back side structure is determined in part by the doping pattern but also by the dopant profile as created under the implant conditions including dopant species, dose, energy, temperature, pressure, and dose rate. It is to be understood that the ring 412 may be wider or narrower than that shown and may be moved closer to or farther from the edge of the wafer 410. Moreover, multiple, generally concentric rings 412, 414 may be implanted on the back side 410a of wafer 410 and the rings may differ in width as shown in FIG. 10. While two rings are shown in FIG. 10 a greater or fewer number of rings may be provided. The structure may also comprise arcs of a circle 412a, 412b rather than complete rings as shown in FIG. 11. While the rings in FIGS. 9-11 are shown as circular, the rings may have other shapes and still be considered a ring shape. For example, the rings may comprise multisided structures such as, but not limited to, a hexagonal structure 416 (FIG. 12), a pentagonal structure 418 (FIG. 13), an octagonal structure 420 (FIG. 14), or lower- or higher-number sided shapes. The rings may also comprise ovate rings 422 (FIG. 15) or even irregular shaped rings 424 (FIG. 16). The multisided rings may follow the crystallographic structure of the wafer or the multisided rings may be arranged offset from the crystallographic structure of the wafer.

Figure 17:
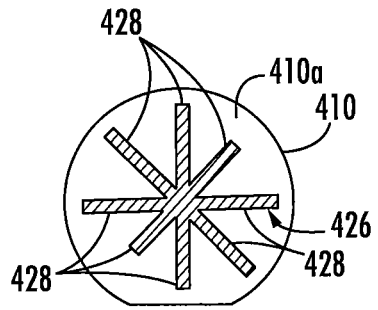

Referring to FIG. 17, in one embodiment the back side 410a of the wafer 410 may be doped with a dopant profile to create a ribbed structure 426. The ribbed structure 426 may comprise a plurality of ribs 428 that extend in a radial manner. The ribbed structure 426 may include a greater or fewer number of ribs than shown in FIG. 17 and the ribs may be wider, narrower, shorter or longer than the ribs shown in FIG. 17. Moreover, different ones of the ribs may extend for different lengths and widths than other ones of the ribs.

Figure 18:
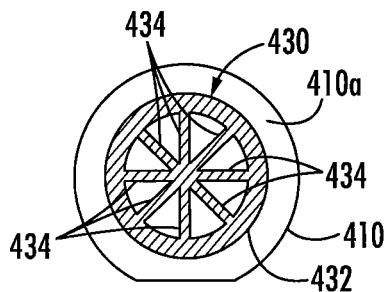
Figure 19:
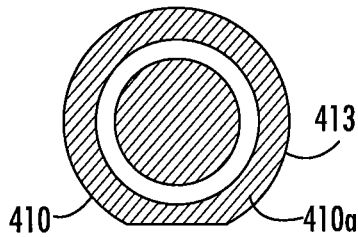

Referring to FIG. 18, in another embodiment the back side 410a of the wafer 410 may be doped with a dopant profile to create a ring and ribbed or "wheel" structure 430. The structure 430 may include one or more rings 432 and plural ribs 434 which may be shaped as previously described.

Figure 20:
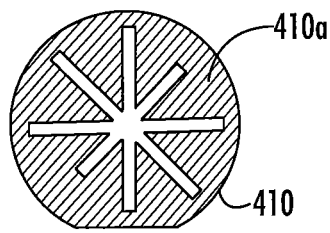
Figure 21:
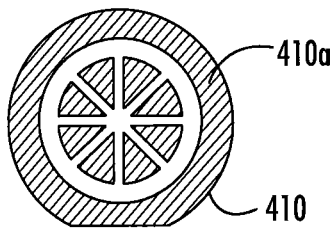

The inverse of the structures may also be used. For example, referring to FIG. 19, the back side 410a of the wafer 410 is doped with a dopant profile to create a ring structure that is the inverse of FIG. 9. Referring to FIG. 20 the back side 410a of the wafer 410 may be doped with a dopant profile to create a ribbed structure that is the inverse of FIG. 17. Referring to FIG. 21 in another embodiment the back side 410a of the wafer 410 may be doped with a dopant profile to create a structure that is the inverse of the ring and ribbed structure of FIG. 18. While specific preferred patterns are shown and described the implanted area on the back side may have any suitable pattern provided it shapes the wafer to a desired final shape.

Figure 22:
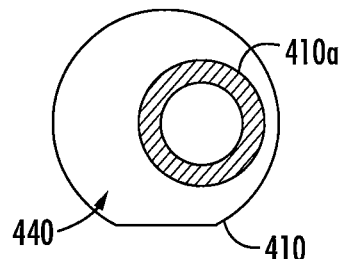
Figure 23:
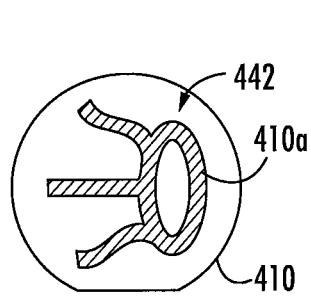

The structures described above are arranged in generally axially symmetric patterns relative to the wafer. However, the back side structures 440, 442 may be arranged asymmetrically relative to the wafer as shown in FIGS. 22 and 23, respectively. Any of the structures described herein may be arranged symmetrically or asymmetrically.

Figure 24:
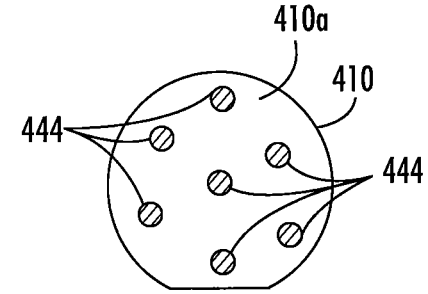
Figure 25:
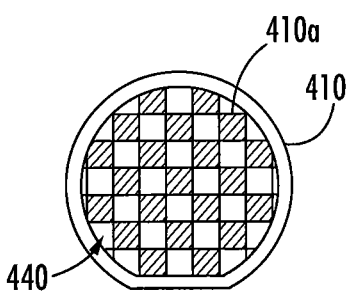

In other embodiments, the back side structure may comprise discrete implanted areas. For example, as shown in FIG. 24 the back side 410a of wafer 410 structure may comprise implanted areas 444 spaced from one another over the surface of the wafer. The implanted areas 444 may be irregularly spaced and shaped as shown in FIG. 24, or the implanted areas 444 may be of more uniform shape and arranged in a pattern such as the grid shown in FIG. 25.

The structures as described with respect to FIGS. 8 through 26 may be used in the process described with respect to FIGS. 6 and 7 where the back side structures are created as part of the doping process of the front side. In such a process, the dopant profiles that create the back side structures may be implanted in alternating processes with the front side doping processes. The structures as described with respect to FIGS. 8 through 26 may be used in the process described with respect to FIGS. 8 and 26A through 26E to create a blank wafer.

Referring again to FIGS. 3 and 4, exemplary methods of fabricating a wafer according to some embodiments of the present invention will be described. If masking of either the front side or the back side of the wafer is required in order to implant the dopant in a desired pattern, the wafer is masked as previously described. If implantation is to be performed over the entire front side and/or back side no masking is required. If no masking is required, the masking steps may be omitted. The front side and back side may be masked in the same manner to create the same implantation pattern on the front side and the back side or the front side and the back side may be masked differently as described above. The wafer plate 110a and wafer 115a are introduced into an ion implantation target chamber 120 by loading arm 125a oriented to present a first side of the wafer for implantation. The loading arm 125a may be removed from the ion implantation chamber. Either the front side or the back side of the wafer may be presented for implantation first as previously described. Dopant 150 is implanted on the first side of the wafer. If the first side of the wafer is the front side, the dopant is applied to the first side as is known to create the desired semiconductor device. If the first side of the wafer is the back side, the dopant is applied to create the dopant profile that defines the back side structure as described herein.

After the first side is implanted, the wafer plate 110a and wafer 115a are removed from the chamber 120 by loading arm 125a. The wafer is then reoriented to present the second side of the wafer for implantation. In one embodiment, the wafer 115a is rotated 180 degrees, i.e. flipped over, and placed on a wafer plate 110 such that the second side of the wafer is disposed for implantation. In some embodiments, the wafer may be flipped over on the wafer plate to expose the back side of the wafer to the dopant. In other embodiments, the wafer plate and wafer may be flipped over together. For example, the wafer plate 110 may be provided with a large counterbored aperture 111 that allows access to the back side of the wafer. The wafer may then be reintroduced into the implantation chamber 120 by loading arm 125a. The implantation process is repeated on the second side of the wafer. If the second side of the wafer is the back side, the dopant is applied to the second side in the desired back side dopant profile and structure as described above. If the second side of the wafer is the front side, the dopant is applied to the first side as is known to create the desired semiconductor device. It is to be understood that the implantation process may include multiple processes on each side of the wafer and that these processes may alternate on the front and back sides as described above. The wafer, having been shaped by implantation on both sides, may then be removed from the implantation chamber and processed further as is known in the art.

In still another process two separate ion implantation target chambers 120 may be used where one implantation chamber implants the dopant on the front side and the other chamber implants the back side structure. In such a process, the wafer is introduced into a first ion implantation target chamber 120 and dopant is implanted on the first side of the wafer as described above to dope the front side of the wafer or to create the back side structure. The wafer is removed from the first ion implantation target chamber 120 by loading arm 125a. The wafer may then be rotated 180 degrees, i.e. flipped over, and placed on a wafer plate such that the second side of the wafer is disposed for implantation. Alternatively, the wafer plate and wafer may be rotated 180 degrees, i.e. flipped over, as described above. The wafer may then be inserted into a second ion implantation target chamber 120 and the implantation process repeated on the second side to dope the wafer or to create the back side structure. The wafer having been implanted on both sides may then be removed from the second ion implantation chamber and processed further as is known in the art.

In another embodiment of fabricating a semiconductor device according to some embodiments of the present invention, the method may be performed with an ion implantation target chamber where two ion streams are provided in the same ion implantation target chamber. The wafer is introduced into the ion implantation target chamber and the wafer is oriented such that the front side faces a first ion stream and the back side faces a second ion stream. Dopant is implanted on the front side of the wafer and the back side of the wafer where two ion streams operate in a single chamber. It should be understood that the two ion streams may be operated substantially simultaneously. Alternatively, the two ion streams may be operated sequentially. In either case, further reorientation of the wafer between the two ion implantation processes may not be required; however, the wafer may be reoriented between the two ion implantation processes. The wafer having been implanted on both sides may be removed from the implantation chamber and processed further as is known in the art.

In another embodiment of fabricating a semiconductor device according to some embodiments of the present invention the method may be performed with a loading arm 125a that reorients the wafer in the ion implantation chamber. In such an embodiment, the wafer is introduced into an ion implantation target chamber and the wafer is oriented such that a first side of the wafer faces a first ion stream. Dopant is implanted on the first side of the wafer. The wafer is then reoriented by the loading arm 125a to present the second side of the wafer for implantation. The implantation process is performed on the second side to implant the desired structure. The wafer having been implanted on both sides may then be removed from the implantation chamber and processed further as is known in the art. In this and other embodiments described herein some or all of the steps may be automated.

Figure 28:
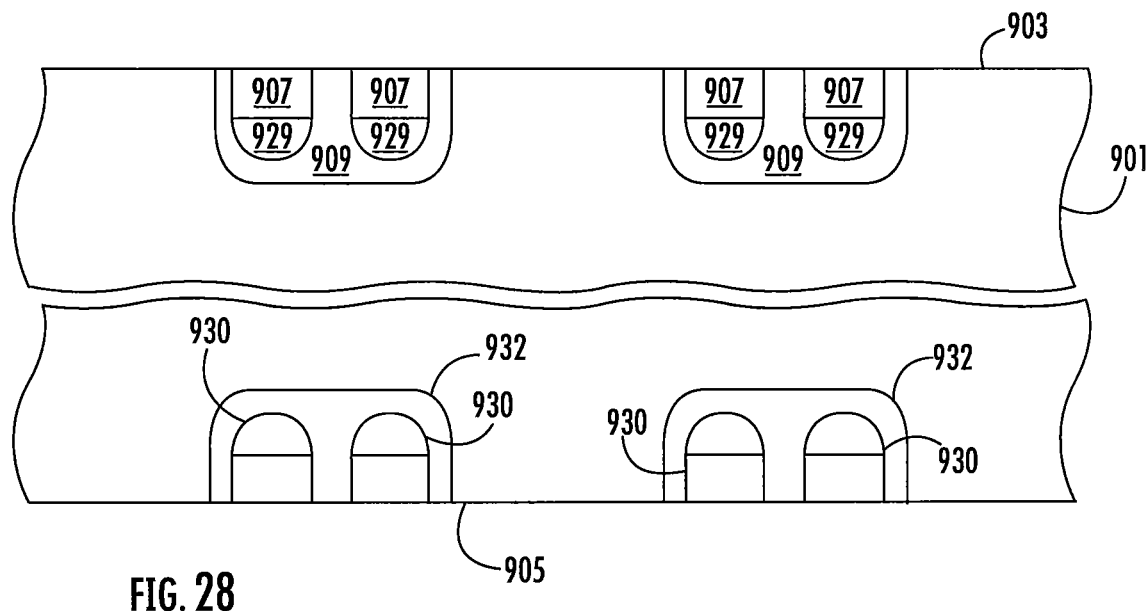
FIGS. 28 through 30 are cross-sectional views illustrating operations of fabricating a semiconductor device.
Figure 29:
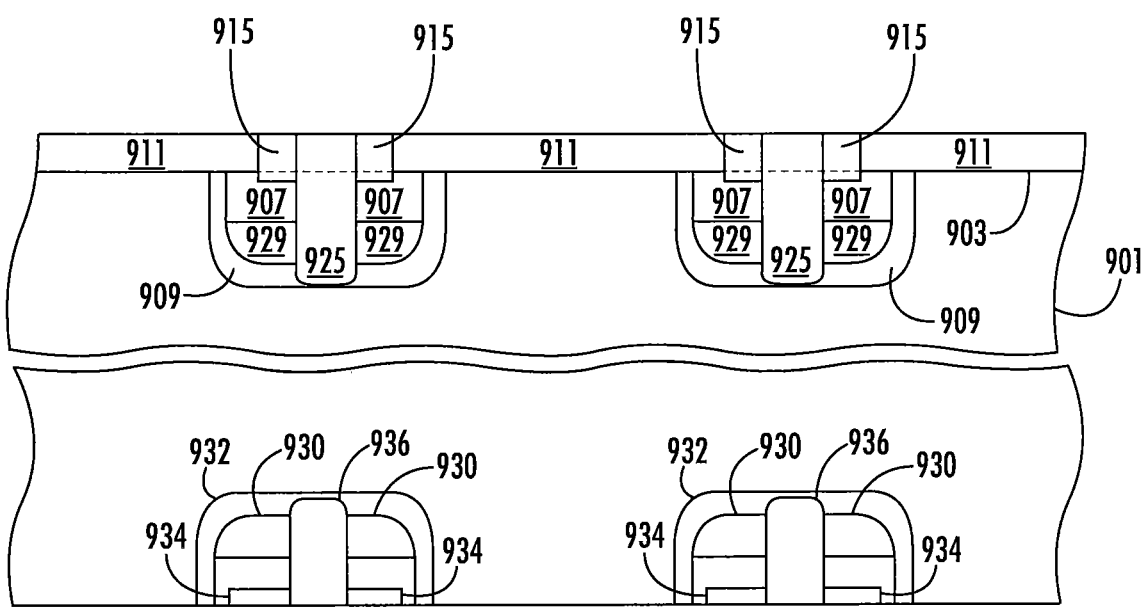
Figure 30:
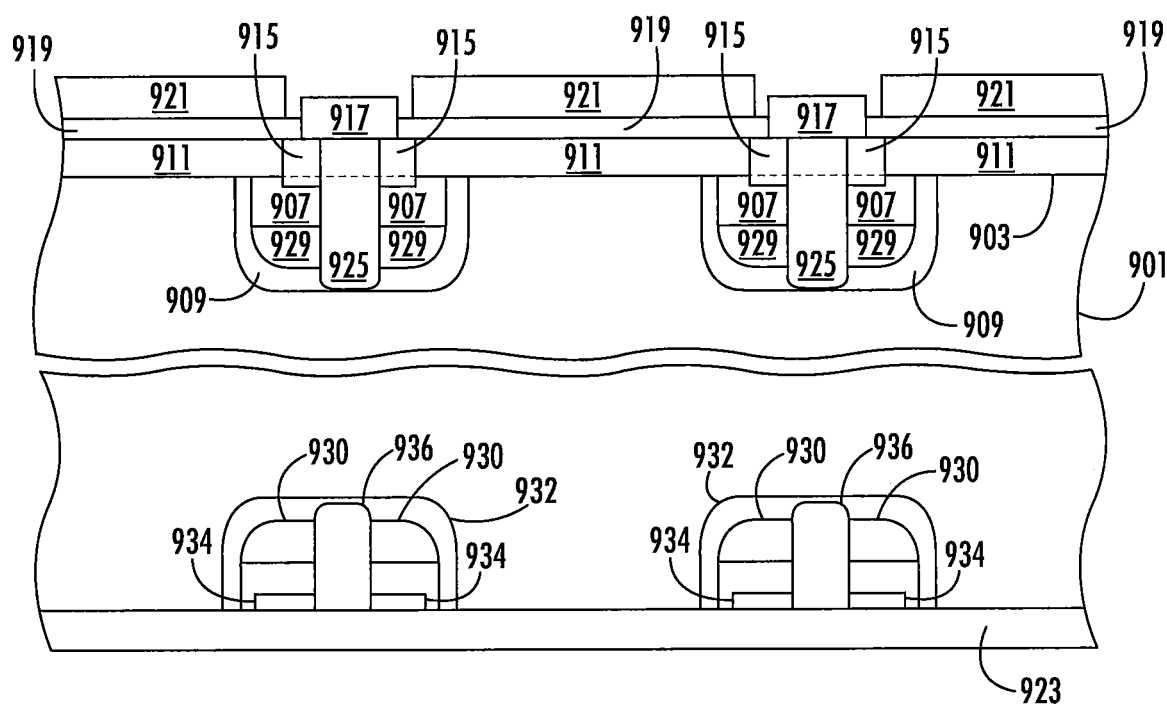

It will be appreciated that embodiments disclosed herein can be advantageously employed to form many different kinds of semiconductor devices, including, but not limited to, for example, metal semiconductor field effect transistors (MESFETs), insulated gate bipolar transistors (IGBTs), Schottky diodes, PIN diodes, Metal Oxide Semiconductor Field Effect Transistor (MOSFET), double diffused Metal Oxide Semiconductor Field Effect Transistor (DMOSFET), LEDs etc. An exemplary structure that may be formed using such ion implanted layers is illustrated in FIGS. 28 through 30. The device shown in FIGS. 28 through 30 is a DMOSFET device having various regions that can be formed by ion implantation. As shown in FIG. 28, source/drain terminal regions 907 of a first conductivity type (e.g., n-type), buried regions 929 of a second conductivity type (e.g., p-type), and well regions 909 of the second conductivity type (e.g., p-type) may be implanted into front side 903 of a wafer 901 (e.g., silicon carbide layer) of the first conductivity type (e.g., n-type). More particularly, a source/drain implant mask may be used to selectively expose portions of front side 903 for implanting source/drain terminal regions 907 and buried regions 929 of opposite conductivity types. The source/drain implant mask, for example, may cover all portions of front side 903 except those portions into which source/drain terminal regions 907 are to be formed. Such a source/drain implant mask, for example, would cover areas 903 and 909, while exposing areas 907. Different implant energies may be used to implant terminal regions 907 and buried regions 929 at different depths using the same implant mask.

The back side may be masked in the same manner and a back side dopant profile may implanted into the back side 905 to create a desired back side structure 930. In the illustrated embodiment, the back side 905 is implanted in the same pattern and under conditions as the front side 903 such that the stresses/strains and expansion/contraction induced in the front side 903 are offset by equivalent strains induced in the back side 905. However, as explained above, the back side dopant profile and/or structure may be different than the doping on the front side.

After forming source/drain terminal regions 907 and buried regions 929, the source/drain implant mask may be subjected to a timed etch (without requiring a second photolithographic patterning) to thereby widen the previously defined openings for the source/drain terminal regions. The resulting well implant mask may thus have widened openings (relative to the source/drain implant mask) to cover areas 903 while exposing areas labeled 907 and 909. The well implant mask may thus be used to implant well regions 909 surrounding source/drain terminal regions 907, and well regions 909 may be formed by implanting dopants of the second conductivity type into layer 901. While dopants of the second conductivity type may also be implanted into source/drain terminal regions 907, a dopant concentration of the first conductivity type in source/drain terminal regions 907 may be sufficiently high so that the first conductivity type may be maintained in the source/drain terminal regions 907. Accordingly, the well implant mask may be self-aligned with respect to the source/drain implant mask so that both masks may be provided using a same mask layer and using only one photolithographic patterning operation. Once source/drain terminal regions 907, buried regions 929, and well regions 909 have been implanted, the well implant mask may be removed.

The back side 905 may be masked in the same manner and a back side dopant profile may be implanted into the back side 905 to create a back side structure 932. In the illustrated embodiment the back side 905 is implanted in the same pattern and conditions as the front side 903 such that the strains induced in the front side are offset by equivalent strains induced in the back side 905. As previously described the back side structure may be implanted in alternating sequence with the front side doping process.

In other embodiments, a blank wafer having a back side structure already implanted into the wafer may be provided to create the semiconductor device as previously described. In such an embodiment the doping of the front side is performed after the back side dopant profile is implanted to create the back side structure. As previously described, in some embodiments the back side structure may be different than the front side doping.

Referring to FIG. 29, the device may then be further processed to create the semiconductor device. For example, a relatively thin epitaxial semiconductor layer 911 (e.g., a silicon carbide layer) may be formed (e.g., using chemical vapor deposition) on the front side 903 of layer 901 including source/drain terminal regions 907 and well regions 909.

Terminal contact regions 915 of the first conductivity type (e.g., n-type) and well contact regions 925 of the second conductivity type (e.g., p-type) may be implanted through epitaxial semiconductor layer 911 to provide electrical contact with source/drain terminal regions 907 and well regions 909, respectively. In other embodiments, the epitaxial silicon carbide layer may be etched/patterned to expose underlying source/drain terminal and/or well regions. At this point, implantation of additional back side dopant profiles may be implanted to create additional back side structures to offset the strains and stresses induced in the wafer. For example, back side structures 934 and 936 may be implanted into the back side using the same process as was used for areas 915 and 925. However, in some embodiments the implantation of additional back side structures may not be required after every front side doping process.

Gate insulating layer 919, gate electrode 921, and ohmic contacts 917 and 923 may then be formed as shown in FIG. 30. Gate insulating layer 919 may be a layer of silicon oxide, and gate electrode 921 may be a layer of degeneratively doped polysilicon. While a silicon carbide DMOSFET is described and shown, the techniques described herein may be used to create any suitable semiconductor device.

In some embodiments, the back side structures 930, 932, 934, and 936 may be partially or completely ground off of the wafer after the implantation processes are completed before further processing takes place. In such embodiments, the back side structures may not be readily apparent in the finished semiconductor device. However, even in devices where the back side structure is removed, the processes and techniques described herein improve the electrical properties of the wafer.

Although specific embodiments have been shown and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method of fabricating a wafer comprising:
   selectively implanting a first dopant into a front side of the wafer in a first pattern to create an active electrical device structure in a first ion implantation process;
   selecting a dopant profile of a second dopant in response to the first pattern to create a back side structure that controls a shape of the wafer; and
   implanting the second dopant into a back side of the wafer according to the dopant profile of the second dopant in a second ion implantation process, whereby a shape of the wafer is controlled.

2. The method according to claim 1, wherein the first ion implantation process occurs before the second ion implantation process.

3. The method according to claim 1, wherein the second ion implantation process occurs before the first ion implantation process.

4. The method according to claim 1, wherein the dopant profile of the second dopant is the same as a dopant profile of the first dopant.

5. The method according to claim 1, further comprising performing the first ion implantation process under substantially the same conditions as the second ion implantation process.

6. The method according to claim 1, further comprising implanting the first dopant in the first pattern on the front side and implanting the second dopant in a second pattern on the back side.

7. The method according to claim 6, wherein the first pattern and the second pattern are the same.

8. The method according to claim 6, wherein the first pattern and the second pattern are different.

9. The method according to claim 1, further comprising performing the first ion implantation process under different conditions than the second ion implantation process.

10. The method according to claim 1, wherein the back side structure comprises at least one of a ring pattern, a ribbed pattern, a grid pattern and a ring and ribbed pattern.

11. The method according to claim 1, wherein the first ion implantation process comprises implanting at least two first dopants and wherein the second ion implantation process comprises implanting at least two second dopants.

12. The method according to claim 11, comprising implanting the at least two first dopants in an alternating manner with the at least two second dopants.

13. The method according to claim 1, wherein the first dopant and the second dopant are the same.

14. The method according to claim 1, wherein the first dopant and the second dopant are different.

15. The method according to claim 1 wherein the step of implanting a first dopant into a front side of the wafer induces a strain in the wafer; and the step of implanting a second dopant into a back side of the wafer creates a back side structure where the back side structure is configured to at least partially offset the strain in the wafer induced by the first dopant and deformation of the wafer is controlled.

16. The method according to claim 15 wherein the step of implanting a second dopant into a back side of the wafer includes the step of determining the back side structure to at least partially offset the strain in the wafer induced by the first dopant applied to the front side.

* * * * *